United States Patent [19]
Takiguchi et al.

[11] Patent Number: 5,671,242
[45] Date of Patent: Sep. 23, 1997

[54] STRAINED QUANTUM WELL STRUCTURE

[75] Inventors: Tohru Takiguchi; Katsuhiko Goto, both of Itami, Japan

[73] Assignee: Mitsubishi Denki Kabushiki Kaisha, Tokyo, Japan

[21] Appl. No.: 515,909

[22] Filed: Aug. 16, 1995

[30] Foreign Application Priority Data

Sep. 2, 1994 [JP] Japan ................................. 6-209982

[51] Int. Cl.⁶ ............................ H01S 3/19; H01L 29/06
[52] U.S. Cl. ............................. 372/45; 372/46; 257/18
[58] Field of Search ........................ 372/45, 46; 257/18

[56] References Cited

U.S. PATENT DOCUMENTS 5,306,924  4/1994  Usami et al. ........................... 257/18

FOREIGN PATENT DOCUMENTS

| 0543587 | 5/1993 | European Pat. Off. |
| 0545262 | 6/1993 | European Pat. Off. |
| 3-3384 | 1/1991 | Japan |
| 4-234184 | 8/1992 | Japan |
| 5-267777 | 10/1993 | Japan |

OTHER PUBLICATIONS

Briggs et al., "Gain and Threshold Characteristics of Strain–Compensated Multiple–Quantum–Well Lasers", IEEE Photonics Technology letters, vol. 4, No. 5, pp. 423–425 May 1992.

Sato et al., "Monolithic Strained–InGaAsP Multiple–Quantum Well Lasers With Integrated Electroabsorption Modulators for Active Mode Locking", Appl. Phys. Lett., vol. 65, No. 1, Jul. 4, 1994, pp. 1–3.

Emery et al., "Gas Source Molecular Beam Epitaxy of Alternated Tensile/Compressive Strained GaInAsP Multiple Quantum Wells Emitting at 1.5 μm", Journal of Crystal Growth, vol. 127, 1993, pp. 241–245 (no month available).

Houghton et al, "Misfit Strain Relaxation in $Ge_xSi_{a-x}$/Si Hetro–structures: The Stuctural Stability Of Buried Strained Layers And Strained–Layer Superlattices", Journal of Applied Physics, vol. 67, No. 4, 1990, pp. 1850–1862 Feb. 1990.

Katsuyama et al, "Lifetime Test For High–Current–Injection Strained–Layer Superlattice Light–Emitting Diode", IEEE Electron Letts, vol. EDL–8, No. 5, 1987, pp. 240–242 May 1987.

Houghton et al, "Design Criteria For Structurally Stable, Highly Strained Multiple Quantum Well Devices", Applied Physics Letters, vol. 64, No. 4, 1994, pp. 505–507 Jan., 1994.

Temkin et al., "Strained Quatemary Quantum Well Lasers for High Temperature Operation", Appl. Phys. Lett., vol. 63, No. 17, Oct. 23, 1993, pp. 2321–2323.

Seltzer et al., "Zero–Net–Strain and Conventionally Strained InGaAsP/InP Multiquantum Well Lasers", Electronics Letters, vol. 28, No. 1, Jan. 2, 1992, pp. 63–65.

Primary Examiner—Rodney B. Bovernick
Assistant Examiner—Luong-Quyen T. Phan
Attorney, Agent, or Firm—Leydig, Voit & Mayer, Ltd.

[57] ABSTRACT

A semiconductor device includes a substrate having a lattice constant and a stress compensation strained quantum well layer including compressively strained layers having a lattice constant larger than the lattice constant of the substrate and tensively strained layers having a lattice constant smaller than the lattice constant of the substrate which are alternatingly laminated on the substrate, wherein the average strain of the stress compensation strained quantum well layer is a positive quantity. Therefore, the critical thickness of the strained quantum well layer is increased so that the degree of freedom in designing the strained quantum well layer is increased, resulting in a semiconductor device with improved characteristics.

3 Claims, 10 Drawing Sheets

▲ cross hatching
○ specular surface
■ surface defect

▲ cross hatching
○ specular surface
■ surface defect

▲ cross hatching
○ specular surface
■ surface defect

STRAINED QUANTUM WELL STRUCTURE

FIELD OF THE INVENTION

The present invention relates to a semiconductor device including a stress compensation strained quantum well layer in which compressively strained layers having a lattice constant larger than that of the substrate and tensively strained layers having a lattice constant smaller than that of the substrate are alternatingly laminated. More particularly, the invention relates to a strained quantum well layer that can increase the critical thickness thereof.

BACKGROUND OF THE INVENTION

FIG. 9 is a sectional view illustrating a prior art long wavelength laser employing a strained quantum well structure for an active layer. In the figure, reference numeral 101 designates a p type InP substrate having opposite front and rear surfaces. A p type InP cladding layer 102 is disposed on the front surface of the substrate 101. A p type InGaAsP light confining layer 113a is disposed on the p type InP cladding layer 102. A strained quantum well active layer 103 is disposed on the p type InGaAsP light confining layer 113a. An n type InGaAsP light confining layer 113b is disposed on the strained quantum well active layer 103. The cladding layer 102, the p type light confining layer 113a, and the active layer 103 form a mesa. P type InP mesa embedding layers 105, n type InP current blocking layers 106, and p type InP current blocking layers 107 are successively disposed on opposite sides of the mesa. An n type InP cladding layer 104 is disposed on the n type InGaAsP light confining layer 113b and on the p type InP current blocking layers 107. A p side electrode 108 is disposed on the rear surface of the substrate 101, and an n side electrode 109 is disposed on the n type InP cladding layer 104. The upper surface of the structure where the n side electrode 109 is absent is covered with an insulating film 110.

FIG. 10 is an enlarged view of a part of the structure shown in FIG. 9 in the vicinity of the strained quantum well active layer 103. In the figure, the same reference numerals as in FIG. 9 designate the same or corresponding parts. Reference numerals 111 and 112 designate well layers and barrier layers, respectively.

In the strained quantum well active layer, the composition of the well layers is selected so that the lattice constant is larger than the lattice constant of the substrate, whereby a compressive stress is applied to the well layer. When such a strained quantum well active layer is employed in a semiconductor laser, the laser characteristics are improved, for example, the threshold current of the laser is reduced due to the compressive strain applied to the well layer.

In the strained quantum well active layer, however, the strain, the thickness, and the number of the well layers are restricted by the critical thickness, i.e., the maximum thickness with no crystalline defects. When the critical thickness is exceeded, as a result of excessive increase in the strain, the thickness, or the number of the well layers, crystalline defects occur. For example, as described in Journal of Applied Physics, Vol. 67, No. 4, pp. 1850–1862, the critical thickness is reduced with an increase in the strain. In a strained quantum well structure in which strained well layers and unstrained barrier layers are alternatingly laminated, when the strain of the well layer is 1% and the thickness of the well layer is 80 Å (8 nm), only a few well layers can be laminated. Accordingly, it is difficult to reduce the threshold current by increasing the strain of the well layer or to improve the high-speed response by increasing the number of the well layers.

As a countermeasure to the above-described problem, a stress compensation strained quantum well structure in which compressively strained layers having a lattice constant larger than that of the substrate and tensively strained layers having a lattice constant smaller than that of the substrate are alternatingly laminated is employed as the strained quantum well active layer 103 as shown in FIG. 10, to increase the critical thickness of the strained quantum well active layer 103, as described in, for example, IEEE ELECTRON DEVICE LETTERS, Vol. EDL-8, No. 5, May 1987, pp. 240–242. It is described in, for example, Applied Physics Letters, Vol. 64, No. 4, 24 Jan. 1994, pp. 505–507, that the critical thickness attains its maximum when the average strain in the strained quantum well active layer is zero. That is, in the structure shown in FIG. 10, when compressively strained well layers 111 having a lattice constant larger than that of the substrate and tensively strained barrier layers 112 having a lattice constant smaller than that of the substrate are alternatingly laminated so that the average strain in the entire active layer 103 becomes 0%, the maximum critical thickness is attained. To be specific, in accordance with the above-described Applied Physics Letters, Vol. 64, No. 4, 24 Jan. 1994 article, assuming that the compressive strain in the well layer is 1%, the thickness of the well layer is 80 Å (8 nm), and the thickness of the barrier layer is 50 Å (5 nm), the average strain in the entire strained quantum well active layer becomes 0% when the tensile strain in the barrier layer is 1.6%. At this time, as shown in FIG. 11, the largest number of the well layers is realized.

In the Applied Physics Letters, Vol. 64, No. 4, 24 Jan. 1994 article, crystalline defects caused by only misfit dislocations are considered. That is, when the average strain in the entire strained quantum well active layer is 0%, since crystalline defects due to misfit dislocations do not occur until the number of the well layers exceeds a maximum, the maximum critical thickness is realized. However, when a strained quantum well structure is actually fabricated by alternatingly laminating well layers and barrier layers so that the average strain becomes 0% and then the surface of the strained quantum well structure is observed, the surface is not specular but has surface defects, although cross hatching that is a result of crystalline defects due to misfit dislocations is not observed.

As described above, the stress compensation strained quantum well active layer included in the prior art semiconductor device is designed so that the average strain in the entire active layer becomes 0%. Therefore, although crystalline defects due to misfit dislocations hardly occur, when the strained quantum well active layer is actually fabricated, crystalline defects result from factors other than misfit dislocations, whereby the critical thickness cannot be sufficiently increased.

SUMMARY OF THE INVENTION

It is an object of the present invention to provide a semiconductor device including a stress compensation strained quantum well layer in which the critical thickness of the strained quantum well layer can be increased, thereby increasing the degree of freedom in designing the strain, the thickness, and the number of well layers.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device includes a substrate having a lattice constant, and a stress compensation type strained quantum well layer comprising a plurality of compressively strained layers each having a lattice constant larger than the lattice constant of the substrate and a plurality of tensively strained layers each having a lattice constant smaller than the lattice constant of the substrate which are alternatingly laminated on the substrate, wherein the average strain of the stress compensation strained quantum well layer is a positive quantity. Therefore, the critical thickness of the strained quantum well layer is increased, whereby the degree of freedom in designing the strained quantum well layer is increased, resulting in a semiconductor device with improved characteristics.

According to a second aspect of the present invention, a semiconductor device includes a substrate having a lattice constant, and a stress compensation strained quantum well layer comprising a plurality of compressive strain applied layers each having a lattice constant larger than the lattice constant of the substrate and a plurality of tensile strain applied layers each having a lattice constant smaller than the lattice constant of the substrate which are alternatingly laminated on the substrate, wherein the average strain of the stress compensation strained quantum well layer is in a range from +0.2% to +0.6%. Therefore, the critical thickness of the strained quantum well layer is significantly increased, whereby the degree of freedom in designing the strained quantum well layer is increased, resulting in a semiconductor device with improved characteristics.

According to a third aspect of the present invention, a semiconductor laser includes a substrate having a lattice constant, and a stress compensation strained quantum well layer, as an active layer, comprising a plurality of compressive strain applied layers each having a lattice constant larger than the lattice constant of the substrate and a plurality of tensile strain applied layers each having a lattice constant smaller than the lattice constant of the substrate which are alternatingly laminated on the substrate, wherein the average strain of the stress compensation strained quantum well active layer is a positive quantity. Therefore, the critical thickness of the strained quantum well layer is increased, whereby the degree of freedom in designing the strained quantum well layer is increased, resulting in a semiconductor laser with improved characteristics.

According to a fourth aspect of the present invention, a semiconductor laser includes a substrate having a lattice constant, and a stress compensation strained quantum well layer, as an active layer, comprising a plurality of compressive strain applied layers each having a lattice constant larger than the lattice constant of the substrate and a plurality of tensile strain applied layers each having a lattice constant smaller than the lattice constant of the substrate which are alternatingly laminated on the substrate, wherein the average strain of the stress compensation strained quantum well active layer is in a range from +0.2% to +0.6%. Therefore, the critical thickness of the strained quantum well layer is significantly increased, whereby the degree of freedom in designing the strained quantum well layer is increased, resulting in a semiconductor laser with improved characteristics.

According to a fifth aspect of the present invention, a semiconductor optical modulator includes a substrate having a lattice constant, and a stress compensation strained quantum well layer, as an optical waveguide layer, comprising a plurality of compressive strain applied layers each having a lattice constant larger than the lattice constant of the substrate and a plurality of tensile strain applied layers each having a lattice constant smaller than the lattice constant of the substrate which are alternatingly laminated on the substrate, wherein the average strain of the stress compensation strained quantum well optical waveguide layer is a positive quantity. Therefore, the critical thickness of the strained quantum well layer is increased, whereby the degree of freedom in designing the strained quantum well layer is increased, resulting in a semiconductor optical modulator with improved characteristics.

According to a sixth aspect of the present invention, a semiconductor optical modulator includes a substrate having a lattice constant, and a stress compensation strained quantum well layer, as an optical waveguide layer, comprising a plurality of compressive strain applied layers each having a lattice constant larger than the lattice constant of the substrate and a plurality of tensile strain applied layers each having a lattice constant smaller than the lattice constant of the substrate which are alternatingly laminated on the substrate, wherein the average strain of the stress compensation strained quantum well optical waveguide layer is in a range from +0.2% to +0.6%. Therefore, the critical thickness of the strained quantum well layer is significantly increased, whereby the degree of freedom in designing the strained quantum well layer is increased, resulting in a semiconductor optical modulator with improved characteristics.

DETAILED DESCRIPTION OF THE PREFERRED EMBODIMENTS

Embodiment 1.

A description is given of a semiconductor device according to a first embodiment of the present invention.

Figure 1:
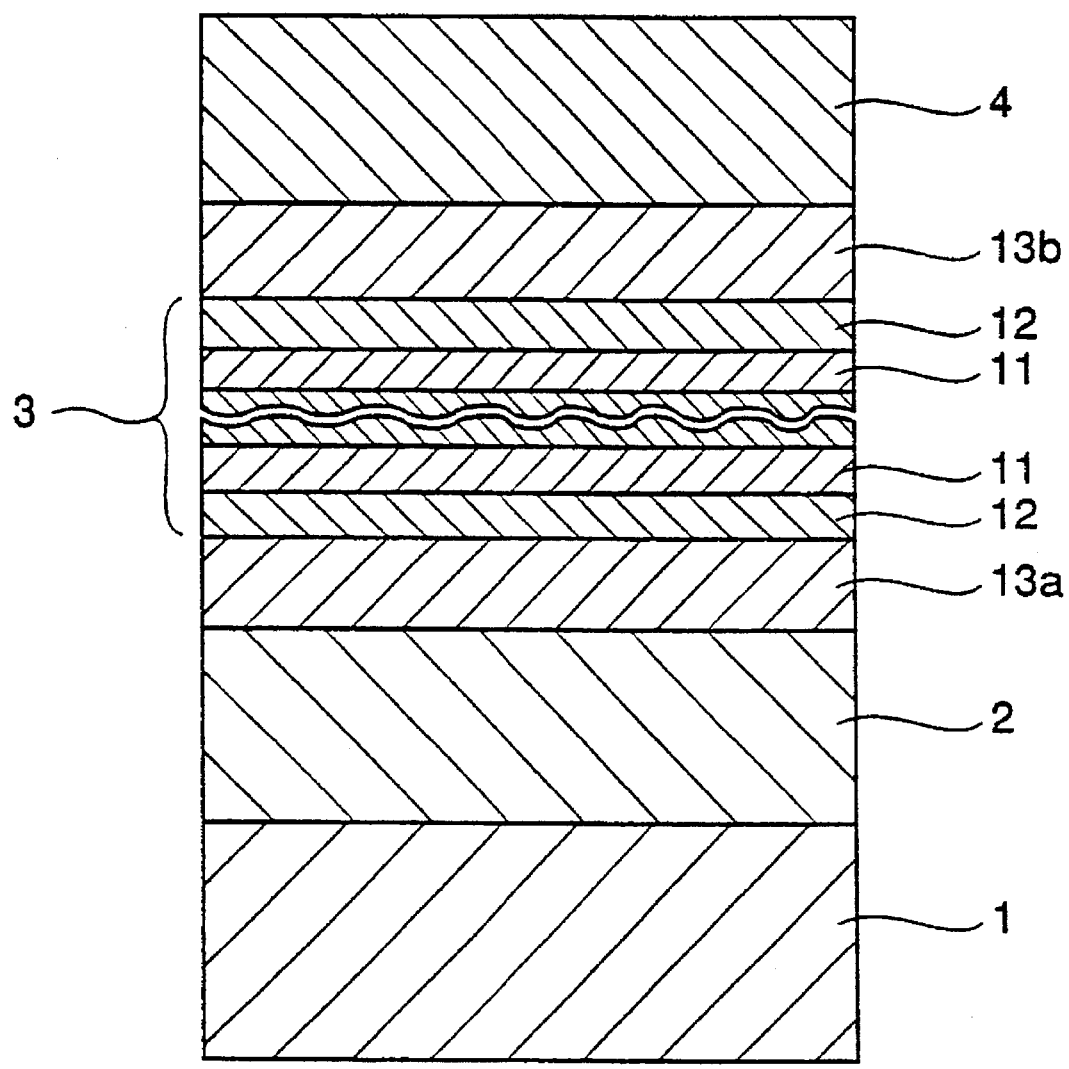
FIG. 1 is a diagram illustrating a structure of a model employed in an experiment for obtaining a semiconductor device in accordance with a first embodiment of the present invention.

FIG. 1 is a sectional view illustrating a model employed in an experiment for producing a semiconductor device according to the first embodiment of the invention. In FIG. 1, reference numeral 1 designates an InP substrate. An InP layer 2 having a thickness of 2 μm is disposed on the substrate 1. An $In_{0.85}Ga_{0.15}As_{0.32}P_{0.68}$ layer 13a having a thickness of 60 nm is disposed on the InP layer 2. A stress compensation strained quantum well layer 3 is disposed on the $In_{0.85}Ga_{0.15}As_{0.32}P_{0.68}$ layer 13a. The stress compensation strained quantum well layer 3 comprises a plurality of $In_{1-x}Ga_xAs_yP_{1-y}$ barrier layers 12 each having a thickness of 50 Å (5 nm) and a plurality of $In_{0.9}Ga_{0.1}As_{0.52}P_{0.48}$ well layers 11 each having a thickness of 80 Å (8 nm) which are alternatingly laminated. An $In_{0.85}Ga_{0.15}As_{0.32}P_{0.68}$ layer 13b having a thickness of 60 nm is disposed on the stress compensation strained quantum well layer 3. An InP layer 4 having a thickness of 0.5 μm is disposed on the $In_{0.85}Ga_{0.15}As_{0.32}P_{0.68}$ layer 13b.

In the present invention, assuming that the lattice constant of the substrate is, the lattice constant of the well layer is $a_w$, the lattice constant of the barrier layer is $a_b$, the strain in the well layer is $\epsilon_w$, the strain in the barrier layer is $\epsilon_b$, the thickness of the well layer is $t_w$, the thickness of the barrier layer is $t_b$, and the average strain in the stress compensation strained quantum well layer is $\epsilon_{average}$, the following relationships are defined.

$$\epsilon_w = (a_w - a_s)/a_s$$

$$\epsilon_b = (a_b - a_s)/a_s$$

$$\epsilon_{average} = (\epsilon_w \cdot t_w + \epsilon_b \cdot t_b)/(t_w + t_b)$$

Further, the stress compensation strained quantum well layer is a strained quantum well layer in which compressively strained layers having a lattice constant larger than that of the substrate and tensively strained layers having a lattice constant smaller than that of the substrate are alternatingly laminated, and the following relationships are defined.

$$|\epsilon_w| > 0.001$$

$$|\epsilon_b| > 0.001$$

In the model structure shown in FIG. 1, the strain $\epsilon_w$ of the well layer is +1%. In addition, the lattice constant of $In_{0.85}Ga_{0.15}As_{0.32}P_{0.68}$ is the same as the lattice constant of InP, so that the strain in the layers 13a and 13b is 0%.

In the experiment, the composition of the barrier layer 12 is varied in the model shown in FIG. 1 to vary the average strain in the stress compensation strained quantum well layer 3, and a plurality of barrier layers and a plurality of well layers are alternatingly laminated at each average strain, followed by observation of the surface of the model with a differential interference microscope. The compositions of the $In_{1-x}Ga_xAs_yP_{1-y}$ barrier layer 12, the strains in the barrier layer 12, and the average strains in the stress compensation strained quantum well layer are represented in the following table 1.

In table 1, a stress compensation strained quantum well structure is not obtained when the strain in the barrier layer is 0% and 0.2%.

TABLE 1

| strain in barrier layer | X | Y | average strain in strained quantum well |
|---|---|---|---|
| 0.2 | 0.1 | 0.28 | 0.69 |
| 0 | 0.15 | 0.32 | 0.62 |
| −0.1 | 0.17 | 0.34 | 0.58 |
| −0.2 | 0.19 | 0.36 | 0.54 |
| −0.3 | 0.22 | 0.38 | 0.5 |
| −0.4 | 0.24 | 0.4 | 0.46 |
| −0.5 | 0.27 | 0.43 | 0.42 |
| −0.6 | 0.29 | 0.45 | 0.38 |
| −0.8 | 0.35 | 0.5 | 0.31 |
| −1 | 0.4 | 0.56 | 0.23 |
| −1.2 | 0.46 | 0.62 | 0.15 |
| −1.4 | 0.52 | 0.69 | 0.08 |
| −1.6 | 0.58 | 0.76 | 0 |

Figure 2:
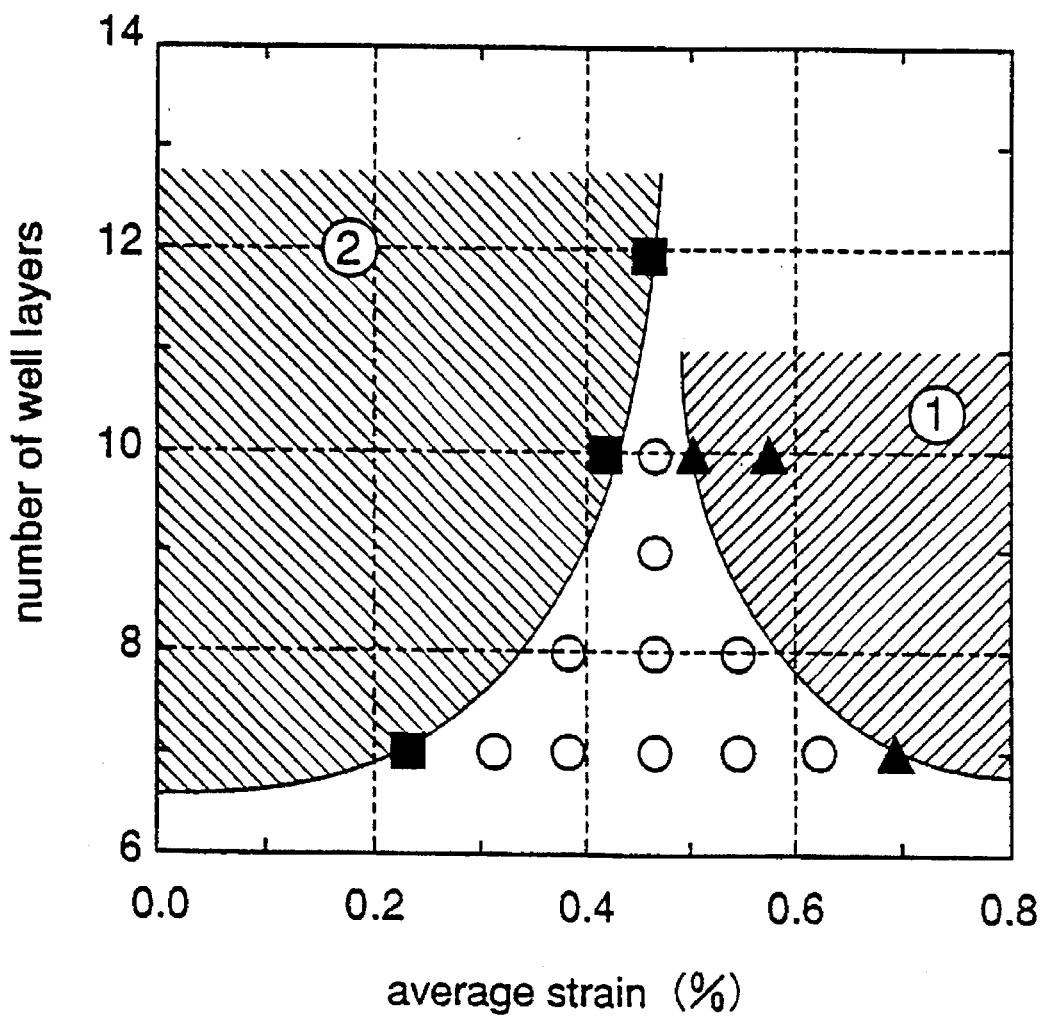
FIG. 2 is a graph illustrating the relationship between the number of well layers and surface morphology at different average strains of strained quantum well layers, according to the results of the experiment using the model shown in FIG. 1.

FIG. 2 is a graph showing the relationship between the number of well layers and the surface morphology at different average strains of the respective strained quantum well layers, according to the results of the experiment. In the graph, the abscissa shows the average strain in the stress compensation strained quantum well layer 3 and the ordinate shows the number of well layers, i.e., the number of barrier and well laminating periods. In FIG. 2, crystalline defects occur in hatched regions ① and ②. More specifically, in the hatched region ①, since the average strain is large, misfit dislocations are introduced, resulting in hatching or cross hatching of the crystal surface. In the hatched region ②, since the average strain is small, i.e., since the tensile strain in the barrier layer is large, three-dimensional growth takes place, resulting in crystalline defects at the surface. As shown in FIG. 2, when the average strain of the strained quantum well active layer 3 is not zero but has a positive value, especially when it is in a range from +0.2% to +0.6%, the critical thickness is increased.

Figure 3:
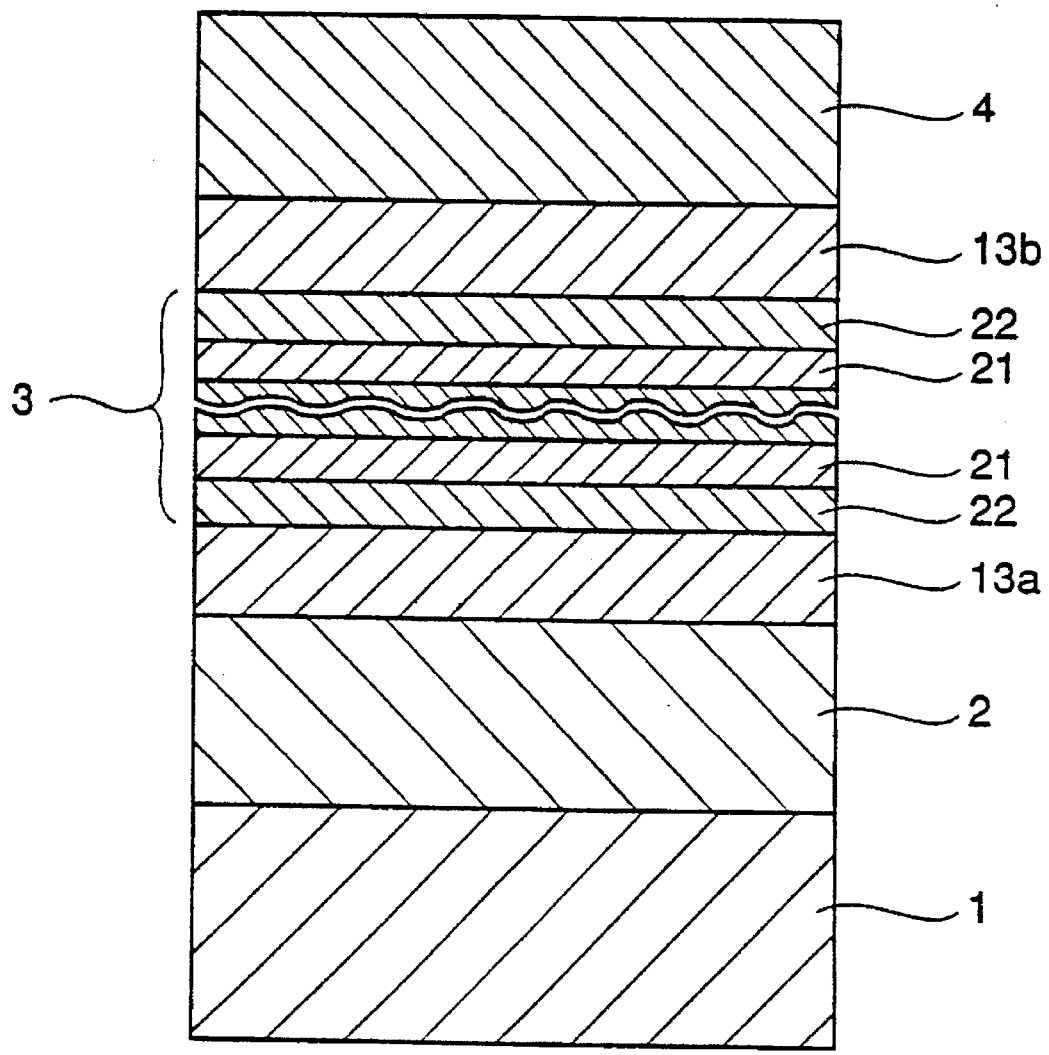
FIG. 3 is a diagram illustrating a structure of another model employed in the experiment for obtaining a semiconductor device in accordance with the first embodiment of the present invention.

FIG. 3 is a sectional view of another model employed in the experiment for obtaining a semiconductor device according to the first embodiment of the invention. In FIG. 3, the same reference numerals as in FIG. 1 designate the same parts. Reference numeral 21 designates $In_{0.84}Ga_{0.16}As_{0.65}P_{0.35}$ well layers each having a thickness of 40 Å (4 nm), and numeral 22 designates $In_{1-x}Ga_xAs_yP_{1-y}$ barrier layers each having a thickness of 50 Å (5 nm). The substance of the experiment is identical to the above-described one. That is, in the model shown in FIG. 3, the composition of the barrier layer 22 is varied to vary the average strain in the stress compensation strained quantum well layer 3, and a plurality of barrier layers and a plurality of well layers are alternatingly laminated at each average strain, followed by observation of the surface of the model with a differential interference microscope. The compositions of the $In_{1-x}Ga_xAs_yP_{1-y}$ barrier layer 22, the strains in the barrier layer 22 and the average strains in the stress compensation strained quantum well layer 3 at different compositions of the barrier layer 22 are shown in the following table 2.

TABLE 2

| strain in barrier layer | X | Y | average strain in strained quantum well |
|---|---|---|---|
| 0.2 | 0.1 | 0.28 | 0.56 |
| 0.1 | 0.12 | 0.3 | 0.5 |
| 0 | 0.15 | 0.33 | 0.44 |
| −0.1 | 0.17 | 0.34 | 0.39 |
| −0.2 | 0.19 | 0.36 | 0.33 |
| −0.3 | 0.22 | 0.38 | 0.28 |
| −0.4 | 0.24 | 0.4 | 0.22 |
| −0.6 | 0.29 | 0.45 | 0.11 |
| −0.8 | 0.35 | 0.5 | 0 |

Figure 4:
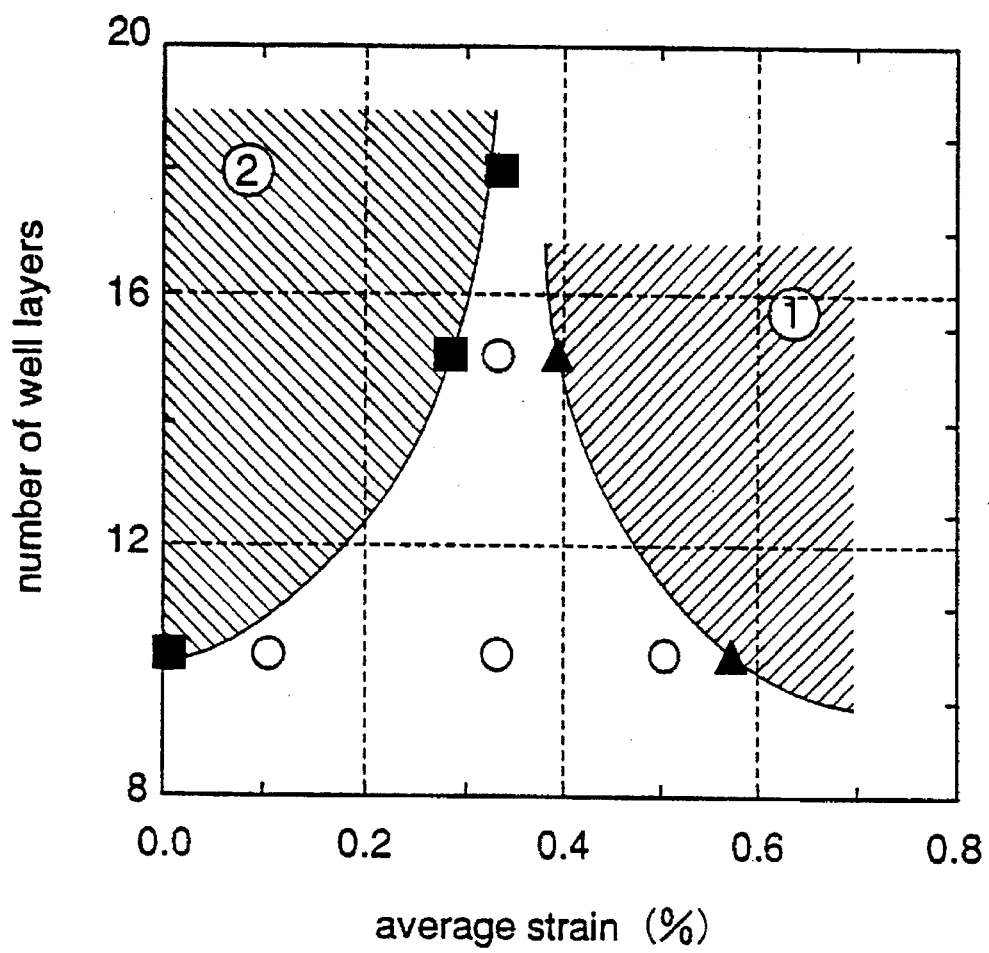
FIG. 4 is a graph illustrating the relationship between the number of well layers and surface morphology at different average strains of strained quantum well layers, according to the results of the experiment using the model shown in FIG. 3.

FIG. 4 is a graph showing the relationship between the number of the well layers and the surface morphology according to the results of the experiment, in which the abscissa shows the average strain in the stress compensation type strained quantum well layer 3 and the ordinate shows the number of well layers, i.e., the number of barrier and sell laminating periods. In FIG. 4, crystalline defects occur in hatched regions ① and ②. More specifically, in the hatched region ①, since the average strain is large, misfit dislocations are introduced, resulting in hatching or cross hatching in the crystal surface. In the hatched region ②, since the average strain is small, i.e., since the tensile strain in the barrier layer is large, three-dimensional growth takes place, resulting in crystalline defects at the surface. Also in the model shown in FIG. 3, as in the model shown in FIG. 1, when the average strain in the strained quantum well active layer 3 is not zero but has a positive quantity, especially when it is in a range from +0.2% to +0.6%, the critical thickness is increased.

As seen from the results of the above-described experiments, when the average strain in the strained quantum well active layer 3 has a positive quantity, especially when it is in a range from +0.2% to +0.6%, the number of the well layers that can be laminated with no crystalline defects is significantly increased.

Figure 5:
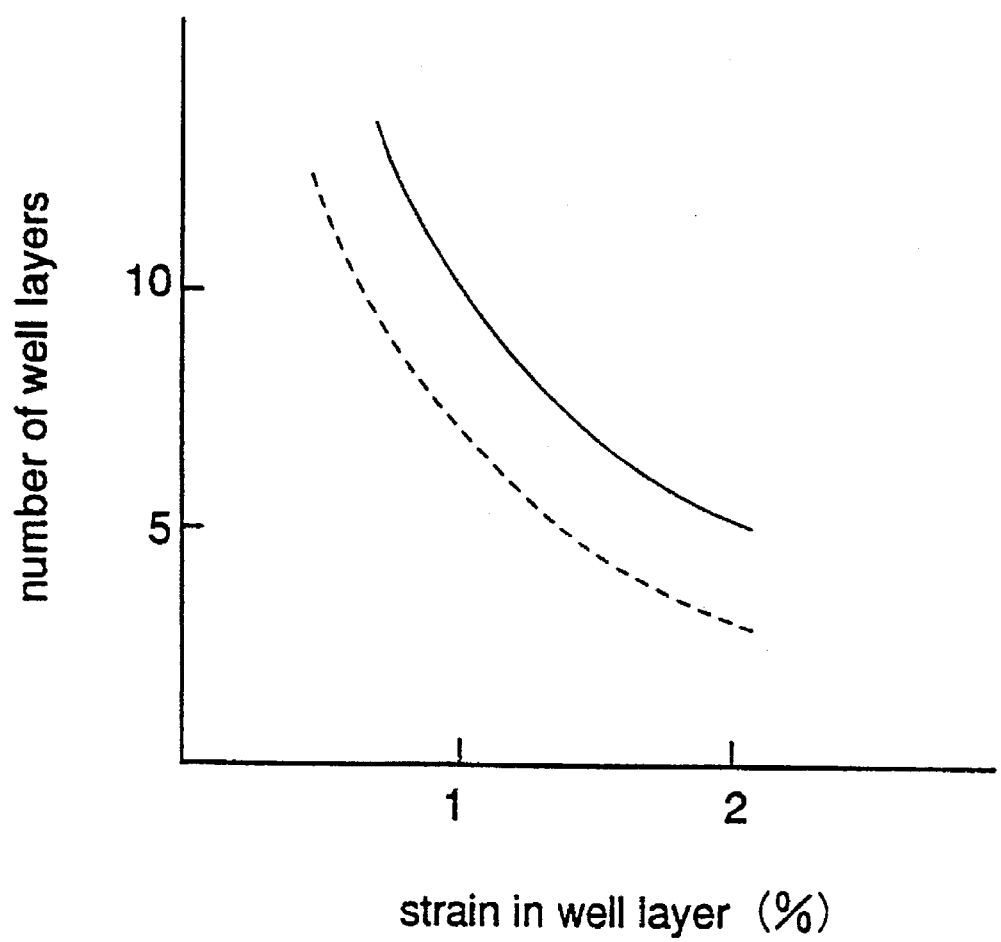
FIG. 5 is a graph for explaining that the strain in the well layer of the strained quantum well layer is increased in the present invention.

FIG. 5 is a graph illustrating the relationship between strain in well layers and the number of well layers that can be laminated with no crystalline defects, in which a continuous line shows the relationship in the stress compensation type strained quantum well layer of a semiconductor device according to the first embodiment of the invention and a dotted line shows the relationship in the prior art stress compensation strained quantum well layer in which the average strain is zero. It is found from the result of the experiment with the model shown in FIG. 1 that the number of the well layers can be increased to ten when the strain in the well layer is 1% in the stress compensation strained quantum well layer of the semiconductor device according to the first embodiment. If the number of the well layers is six as in the prior art device, the strain in the well layer can be increased to about 1.5% as shown in FIG. 5.

As described above, in a semiconductor device according to the first embodiment of the invention, since the average strain in the stress compensation strained quantum well active layer has a positive value, especially, in a range from +0.2% to +0.6%, the critical thickness can be increased. In addition, the strain in the well layer and the number of the well layers can be increased.

Although in the above-described first embodiment InGaAsP is employed for the well layer and the barrier layer, since the crystal structure of InGaAsP is similar to those of other III-V compound semiconductors, the same results as obtained in the experiments according to the first embodiment are promised for stress compensation strained quantum well layers comprising other III-V compound semiconductors. Accordingly, the present invention may be applied to semiconductor devices employing other III-V compound semiconductors, i.e., InGaAs, InGaP, InAsP, GaAsP, InGaAsP, AlGaAs, AlGaP, AlInAs, AlInP, AlGaInAs, AlGaInP, and AlGaAsSb, for well layers and barrier layers, with the same effects as described above. Likewise, although the semiconductor device according to the first embodiment employs an InP substrate, the present invention may be applied to semiconductor devices employing a GaAs or Si substrate.

Embodiment 2.

Figure 6:
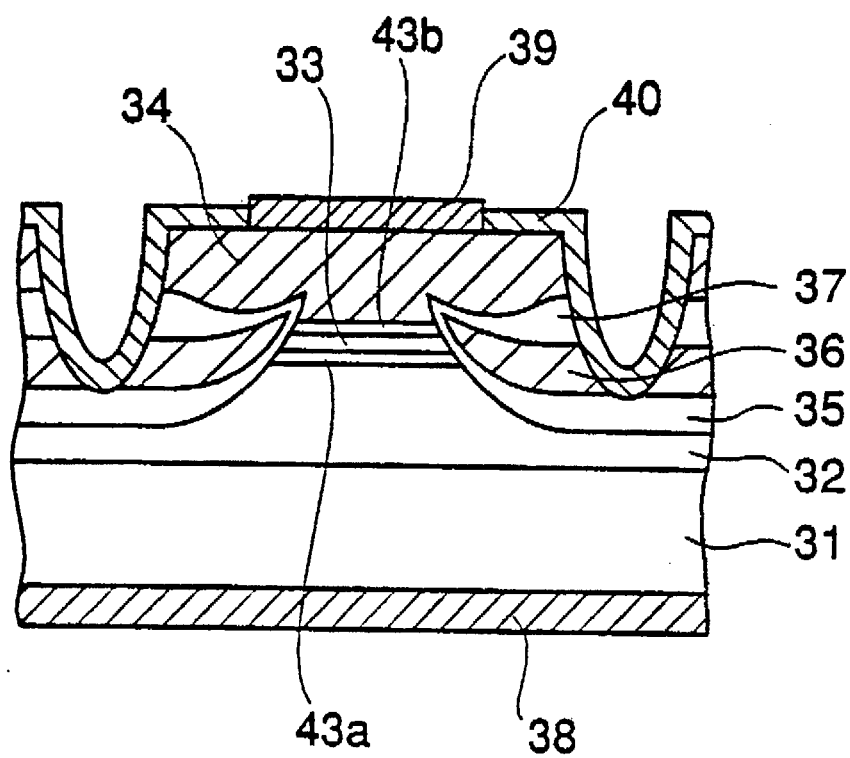
FIG. 6 is a sectional view of a long wavelength semiconductor laser including a stress compensation strained quantum well layer as an active layer in accordance with a second embodiment of the present invention.

FIG. 6 is a sectional view illustrating a long wavelength laser including a strained quantum well active layer in accordance with a second embodiment of the present invention. In FIG. 6, reference numeral 31 designates a p type InP substrate having opposite front and rear surfaces. A p type InP cladding layer 32 is disposed on the front surface of the substrate 31. A p type InGaAsP light confining layer 43a is disposed on the p type InP cladding layer 32. A stress compensation strained quantum well active layer 33 is disposed on the p type InGaAsP light confining layer 43a. An n type InGaAsP light confining layer 43b is disposed on the strained quantum well active layer 33. The n type InGaAsP light confining layer 43b, the strained quantum well active layer 33, the p type InGaAsP light confining layer 43a, and the p type InP cladding layer 32 are formed in a stripe-shaped mesa. P type InP mesa embedding layers 35, n type InP current blocking layers 36, and p type InP current blocking layers 37 are successively disposed on opposite sides of the mesa. An n type InP cladding layer 34 is disposed on the n type InGaAsP light confining layer 43b and on the p type InP current blocking layers 37. A p side electrode 38 is disposed on the rear surface of the substrate 31, and an n side electrode 39 is disposed on the n type InP cladding layer 34. The upper surface of the structure where the n side electrode 39 is absent is covered with an insulating film 40.

Typical thicknesses and carrier concentrations of the above-described layers are as follows.

The p type InP cladding layer 32 has a thickness of 2 μm and a carrier concentration p of $1 \times 10^{18}$ cm$^{-3}$, the n type InP cladding layer 34 has a thickness of 0.5 μm and a carrier concentration n of $1 \times 10^{18}$ cm$^{-3}$, the p type InP mesa embedding layer 35 has a thickness of 1 μm and a carrier concentration p of $1 \times 10^{18}$ cm$^{-3}$, the n type InP current blocking layer 36 has a thickness of 1 μm and a carrier concentration n of $5 \times 10^{18}$ cm$^{-3}$, the p type InP current blocking layer 37 has a thickness of 1 μm and a carrier concentration p of $1 \times 10^{18}$ cm$^{-3}$, the p type InGaAsP light confining layer 43a has a thickness of 50 Å (5 nm) and a carrier concentration p of $1 \times 10^{18}$ cm$^{-3}$ and the n type InGaAsP light confining layer 43b has a thickness of 50 Å (5 nm) and a carrier concentration n of $1 \times 10^{18}$ cm$^{-3}$.

The p side electrode 38 comprises layers of Ti/Pt/Au, and the n side electrode 39 comprises layers of Au/Ge/Ni/Au. The insulating film 40 comprises SiO$_2$.

Figure 7:
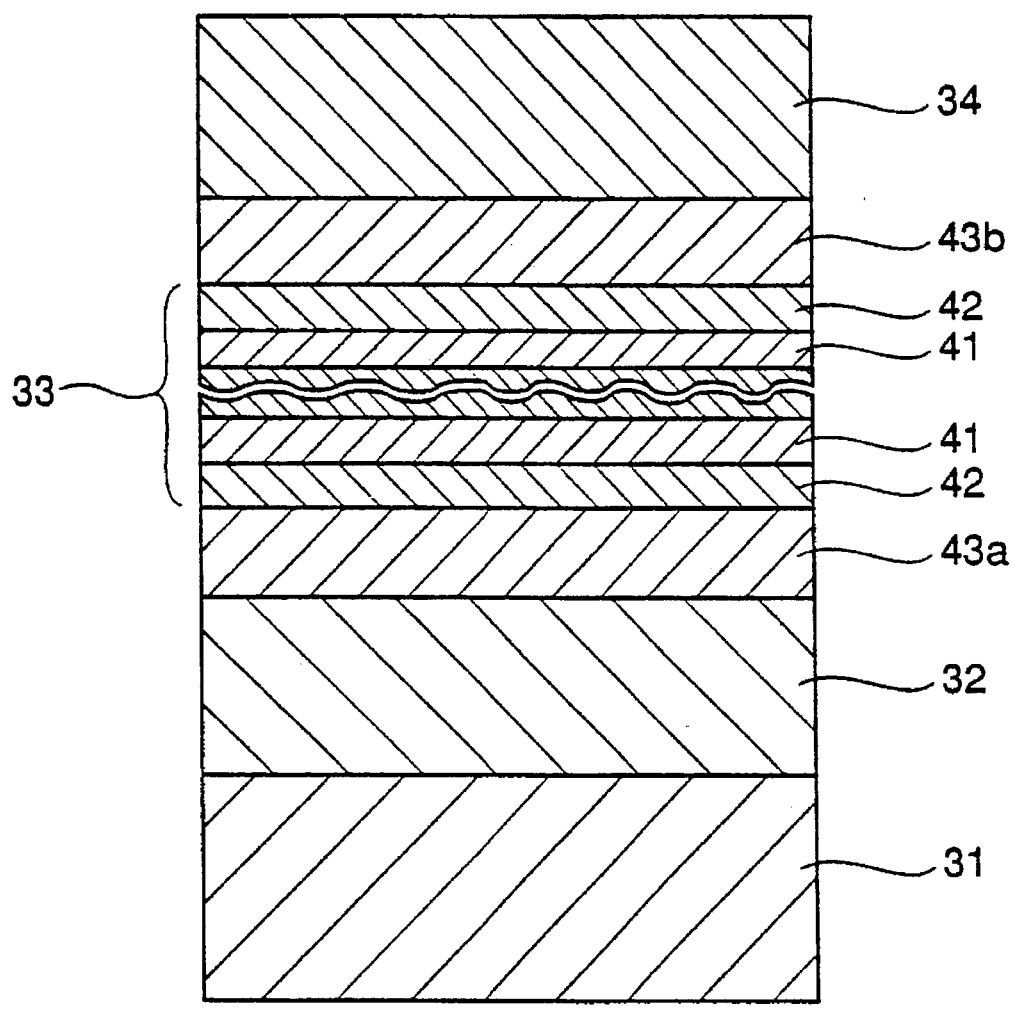
FIG. 7 is an enlarged view of a part of the laser structure shown in FIG. 6 in the vicinity of the stress compensation strained quantum well active layer.

FIG. 7 is an enlarged view of a part of the laser shown in FIG. 6 in the vicinity of the stress compensation strained quantum well active layer 33. In FIG. 7, reference numeral 41 designates InGaAsP well layers, and numeral 42 designates InGaAsP barrier layers.

According to this second embodiment of the invention, in the stress compensation strained quantum well active layer 33, the respective compositions and thicknesses of the well layer 41 and the barrier layer 42 are selected so that the average strain in the strained quantum well active layer 33 is a positive quantity, whereby the critical thickness is increased compared to the prior art strained quantum well layer in which only the well layers are strained and the prior art stress compensation strained quantum well layer in which the average strain is 0. Especially when the respective compositions and thicknesses of the well layers 41 and the barrier layers 42 are selected so that the average strain in the stress compensation strained quantum well active layer 33 is in a range from +0.2% to +0.6%, the critical thickness is significantly increased. Accordingly, in this second embodiment of the invention, the strain in the well layers 41 of the strained quantum well active layer 33 can be increased. As a result of increased strain in the well layers 41, a semiconductor laser with improved laser characteristics, for example, reduced threshold current and increased luminous efficiency, is realized. Further, in this second embodiment, it is possible to increase the number of well layers 41. When the number of well layers 41 is increased, the high-speed response of the laser is improved.

Embodiment 3.

Figure 8:
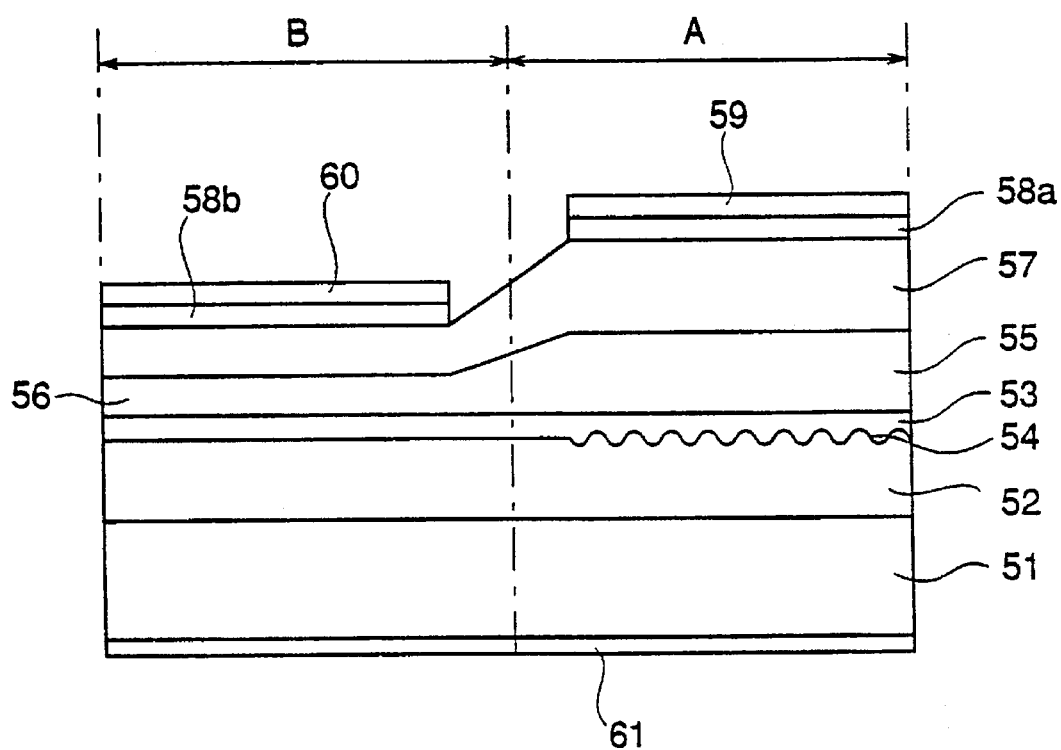
FIG. 8 is a sectional view illustrating an integrated semiconductor optical modulator and laser employing a stress compensation strained quantum well layer for an active layer of the laser and for an optical waveguide layer of the optical modulator in accordance with a third embodiment of the present invention.
Figure 9:
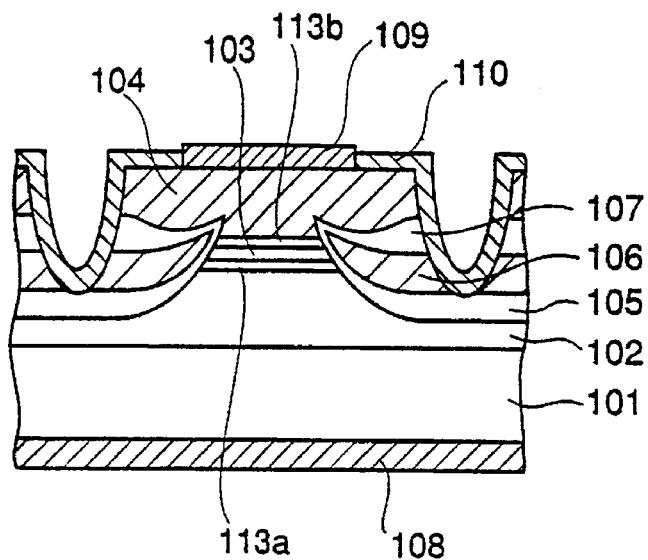
FIG. 9 is a sectional view illustrating a long wavelength semiconductor laser employing a strained quantum well layer for an active layer in accordance with the prior art.
Figure 10:
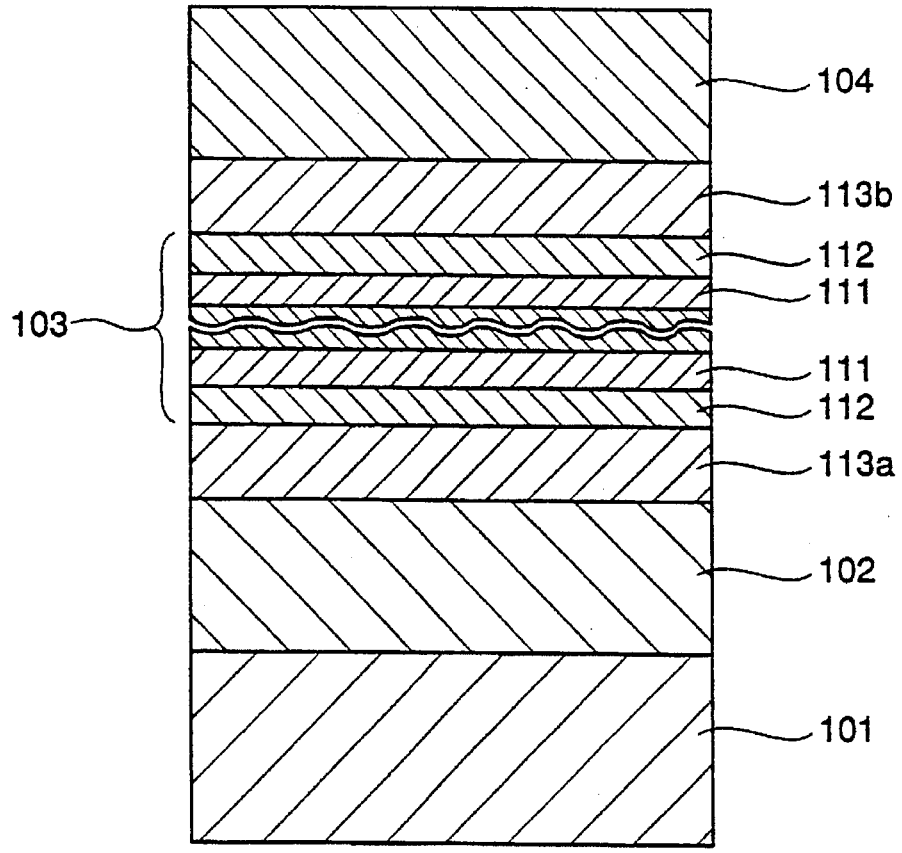
FIG. 10 is an enlarged view of a part of the semiconductor laser shown in FIG. 9 in the vicinity of the strained quantum well active layer.
Figure 11:
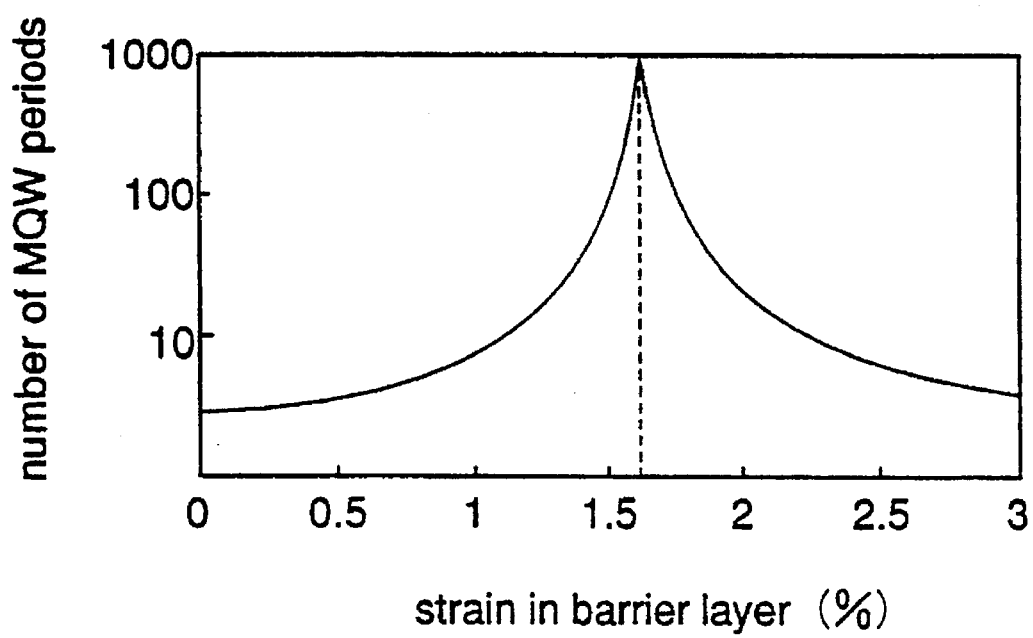
FIG. 11 is a diagram for explaining a structure of a stress compensation strained quantum well layer of a semiconductor device in accordance with the prior art.

FIG. 8 is a sectional view illustrating an integrated semiconductor optical modulator and laser in which a strained quantum well structure is employed for an active layer of the laser and for an optical waveguide layer of the optical modulator. In FIG. 8, reference characters A and B denote a laser section and an optical modulator section, respectively. Reference numeral 51 designates an n type InP substrate having opposite front and rear surfaces. An n type InP cladding layer 52 is disposed on the front surface of the substrate 51. Preferably, the n type InP cladding layer 52 is 2 μm thick and has a carrier concentration n of $1 \times 10^{18}$ cm$^{-3}$. An n type InGaAsP light guide layer 53 is disposed on the n type InP cladding layer 52. Alternating grooves and ridges are formed at the surface of the n type cladding layer 52 in the laser section A. In the region where the alternating grooves and ridges are present, a diffraction grating 54 is produced at the interface between the n type InP cladding layer 52 and the n type InGaAsP light guide layer 53. A stress compensation strained quantum well active layer 55 and a stress compensation strained quantum well optical waveguide layer 56, both comprising alternating well layers and barrier layers (not shown), are disposed on the light guide layer 53 in the laser section A and the modulator section B, respectively. The well layers and the barrier layers are thicker in the strained quantum well active layer 55 than in the strained quantum well optical waveguide layer 56. The strained quantum well active layer 55 and the strained quantum well optical waveguide layer 56 are fabricated simultaneously in a selective growth step using a dielectric mask pattern having an opening that is narrower in the laser section A than in the modulator section B. A p type InP cladding layer 57 is disposed on the strained quantum well active layer 55 and on the strained quantum well optical waveguide layer 56. Preferably, the p type InP cladding layer 57 is 0.5 μm thick and has a carrier concentration p of $1 \times 10^{18}$ cm$^{-3}$. Separated p type InGaAsP contact layers 58$a$ and 58$b$ are disposed on a part of the p type InP cladding layer 57 in the laser section A and on a part of that layer 57 in the modulator section B, respectively. A p side electrode 59 for the laser is disposed on the contact layer 58$a$ and a p side electrode 60 for the optical modulator is disposed on the contact layer 58$b$. Both the p side electrodes 59 and 60 comprise layers of Ti/Pt/Au. A common n side electrode 61 comprising a multilayer metal of Au/Ge/Ni/Au is disposed on the rear surface of the substrate 51.

In this third embodiment of the invention, in the strained quantum well active layer 55 and the strained quantum well optical waveguide layer 56, the compositions and the thicknesses of the well layers and the barrier layers are selected so that the average strain in the stress compensation strained quantum well layer is a positive quantity, whereby the critical thickness is increased, as compared to the prior art strained quantum well layer in which only the well layers are strained and the prior art stress compensation strained quantum well layer in which the average strain is 0. Especially when the respective compositions and thicknesses of the well layers and the barrier layers are selected so that the average strain of the stress compensation strained quantum well layer is in a range from +0.2% to +0.6%, the critical thickness is significantly increased.

A description is given of the operation. As described above, the well layers and the barrier layers included in the strained quantum well active layer 55 are thicker than those included in the strained quantum well optical waveguide layer 56. In the quantum well layer, the effective band gap energy $E_g$ depends on the thickness of the well layer, and the effective band gap energy $E_g$ is reduced with an increase in the thickness of the well layer. Therefore, the effective band gap energy $E_{g1}$ of the strained quantum well active layer 55 is smaller than the effective band gap energy $E_{g2}$ of the strained quantum well optical waveguide layer 56. When a bias voltage in the forward direction of the pn junction is applied across the p side electrode 59 for the laser and the common n side electrode 61 while no bias is applied to the optical modulator, current is injected into the strained quantum well active layer 55 and continuous laser oscillation occurs. Since $E_{g2}$ is larger than $E_{g1}$, laser light is emitted from the facet without being absorbed in the modulator region B. On the other hand, when a reverse bias voltage is applied to the pn junction across the p side electrode 60 for the optical modulator and the common n side electrode 61, the absorption edge due to excitons is shifted toward the long wavelength side as a result of quantum confined Stark effect of the strained quantum well optical waveguide layer 56, and the effective band gap energy $E_{g'2}$ of the optical waveguide layer 56 becomes smaller than the band gap energy $E_{g1}$ of the strained quantum well active layer 55, so that the laser light is absorbed in the optical modulator and extinguished. Accordingly, the on/off state of the laser light can be controlled by the modulating voltage applied to the optical modulator.

In this third embodiment of the invention, as described above, the respective compositions and thicknesses of the well layers and the barrier layers included in the strained quantum well active layer 55 and the strained quantum well optical waveguide layer 56 are selected so that the average strain of the stress compensation strained quantum well layer is a positive quantity, whereby the critical thickness is increased and the strain in the well layer is increased. In addition, the number of well layers can be increased. Therefore, in the semiconductor laser, the threshold current is reduced and the luminous efficiency is improved by increasing the strain in the well layer of the strained quantum well active layer 55. In addition, the high-speed response of the laser is improved by increasing the number of the well layers. On the other hand, in the optical modulator, the bandwidth of the modulator is increased by increasing the strain in the well layer of the strained quantum well optical waveguide layer 56. In addition, the on/off ratio of the laser light is increased by increasing the number of the well layers.

While in the above-described third embodiment emphasis has been placed on an integrated semiconductor optical modulator and laser, the present invention may be applied to a single semiconductor optical modulator that is not integrated with a semiconductor laser.

Further, the present invention may be applied to a wavelength tunable semiconductor laser employing a stress compensation strained quantum well layer for an active layer of a laser and an optical waveguide layer in a wavelength tunable region. In this case, a reduction in threshold current is realized by increasing the strain, and a wide wavelength tunable range is realized by increasing the number of well layers.

Furthermore, the present invention may be applied to a semiconductor optical phase modulator including a stress compensation strained quantum well layer as an optical waveguide layer. In this case, the resonator length is reduced by increasing the number of well layers, whereby the size of the device can be reduced.

What is claimed is:

1. A semiconductor device comprising:

a substrate having a lattice constant $a_s$; and a stress compensation strained quantum well layer having an average strain $\epsilon_{average}$ and comprising a plurality of compressively strained layers, each compressively strained layer having a lattice constant $a_1$ larger than $a_s$ and a thickness $t_1$, to which a strain $\epsilon_1$ ($|\epsilon_1|>0.001$) that is equal to $(a_1-a_s)/a_s$ is applied, and a plurality of tensively strained layers, each tensively strained layer having a lattice constant $a_2$ smaller than $a_s$ and a thickness $t_2$, to which a strain $\epsilon_2$ ($|\epsilon_2|>0.001$) that is equal to $(a_2-a_s)/a_s$ is applied, said compressively strained layers and said tensively strained layers being alternatingly laminated on the substrate, wherein the average strain $\epsilon_{average}$ of the stress compensation strained quantum well layer that is equal to $(\epsilon_1 \cdot t_1+\epsilon_2 \cdot t_2)/(t_1+t_2)$ is in a range from +0.2% to +0.6%.

2. The semiconductor device of claim 1 wherein said semiconductor device is a semiconductor laser including the stress compensation strained quantum well layer as an active layer.

3. The semiconductor device of claim 1 wherein said semiconductor device is a semiconductor optical modulator including the stress compensation strained quantum well layer as an optical waveguide layer.

* * * * *